(12) United States Patent
Springer et al.

(10) Patent No.: US 6,730,569 B2
(45) Date of Patent: May 4, 2004

(54) FIELD EFFECT TRANSISTOR WITH IMPROVED ISOLATION STRUCTURES

(75) Inventors: Lily X. Springer, Dallas, TX (US); Binghua Hu, Plano, TX (US); Chin-Yu Tsai, Plano, TX (US); Jozef C. Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/001,432

(22) Filed: Oct. 25, 2001

(65) Prior Publication Data

US 2002/0074610 A1 Jun. 20, 2002

Related U.S. Application Data

(60) Provisional application No. 60/256,773, filed on Dec. 19, 2000.

(51) Int. Cl.[7] .............................................. H01L 21/336
(52) U.S. Cl. ...................... 438/298; 438/420; 438/449; 438/451
(58) Field of Search .................................. 438/223, 227, 438/228, 297, 298, 420, 449, 451

(56) References Cited

U.S. PATENT DOCUMENTS

| | | | | |
|---|---|---|---|---|
| 4,945,066 A | * | 7/1990 | Kang et al. | 438/252 |
| 5,242,849 A | * | 9/1993 | Sato | 438/443 |
| 5,432,107 A | * | 7/1995 | Uno et al. | 438/276 |
| 5,786,265 A | * | 7/1998 | Hwang et al. | 438/450 |
| 5,841,163 A | * | 11/1998 | Joo et al. | 257/316 |

* cited by examiner

*Primary Examiner*—George Eckert
*Assistant Examiner*—N. Drew Richards
(74) *Attorney, Agent, or Firm*—Peter K. McLarty; W. James Brady, III; Frederick J. Telecky, Jr.

(57) ABSTRACT

An electronic device architecture is described comprising a field effect device in an active region 22 of a substrate 10. Channel stop implant regions 28a and 28b are used as isolation structures and are spaced apart from the active region 22 by extension zones 27a and 27b. The spacing is established by using an inner mask layer 20 and an outer mask layer 26 to define the isolation structures.

14 Claims, 3 Drawing Sheets

FIELD EFFECT TRANSISTOR WITH IMPROVED ISOLATION STRUCTURES

This application claims priority under 35 USC § 119(e)(1) of provisional application No. 60/256,773 filed Dec. 19, 2000.

TECHNICAL FIELD OF THE INVENTION

This invention relates, in general, to the field of electronic devices and, more particularly, to an improved field effect transistor having improved isolation structures and a method for forming the same.

BACKGROUND OF THE INVENTION

The ability to deliver higher performance for less cost in electronic devices depends on the capability of the electronic device designer to construct more active devices in a given surface area on a semiconductor substrate. As active devices are placed closer and closer to one another, the importance of isolation structures between the active devices becomes more critical. Isolation structures typically involve the formation of field oxides and implanted regions and serve to prevent the formation of parasitic devices formed from implanted regions of neighboring structures.

As the active devices themselves are placed closer and closer to the isolation structures however, a new problem has arisen. An active device can be placed in an operational mode so that a breakdown condition is reached resulting in a formation of a parasitic current path through the isolation structure itself. This condition limits the operational characteristics of field effect devices and other active devices.

Accordingly, a need has arisen for an improved field effect transistor and isolation structure architecture that prevents the formation of such parasitic current paths.

SUMMARY OF THE INVENTION

In accordance with the teachings of the present invention, an improved field effect transistor and isolation structure architectures are provided that substantially eliminate or reduce problems associated with prior art structures including the formation of unwanted parasitic current paths which serve to limit the operational characteristics of the field effect device.

In accordance with one embodiment of the present invention, a method for forming a field effect device is presented which comprises covering an active region of a semiconductor layer with a first mask layer. A first channel stop implant process is then used to form first channel stop regions abutting opposing sides of the active region. A second mask layer is then formed covering the first mask layer and portions of the outer surface of the active region and the first channel stop region on opposing sides of the first mask layer. A second channel stop implant is then performed to form second channel stop regions disposed in the outer surface of the semiconductor layer proximate the outer boundaries of the second mask layer.

According to an alternate embodiment of the present invention, the second mask layer can then be removed and field oxide structures can be created while the first mask layer is still in place.

The present invention enjoys the important technical advantage that it allows for the creation of effective channel stop isolation structures but provides for enough spacing between the isolation structures and the active region to prevent the onset of parasitic currents.

BRIEF DESCRIPTION OF THE DRAWINGS

A more complete understanding of the present invention may be acquired by referring to the accompanying figures in which like reference numbers indicate like features and wherein.

DETAILED DESCRIPTION OF THE DRAWINGS

Figure 1A:
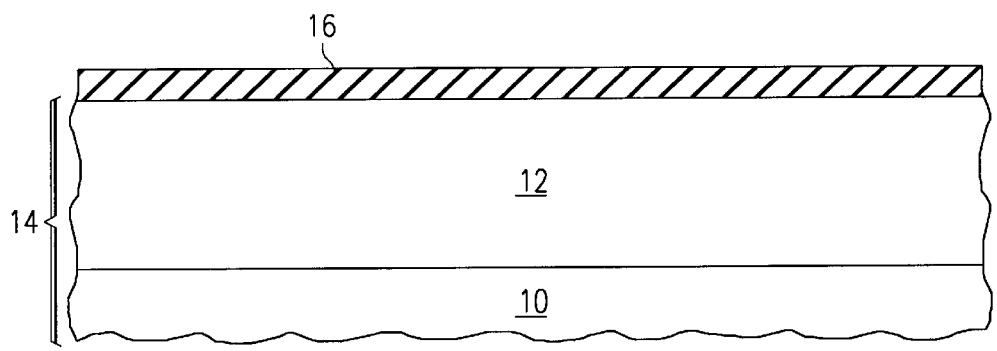
FIGS. 1A through 1G are sequential, cross-sectional, elevational diagrams illustrating the device architecture and method of construction according to the teachings of the present invention.

Referring to FIG. 1A, a semiconductor substrate 10 is provided that may comprise, for example, a silicon substrate which has been doped with P type ions to a resistivity on the order of 0.01 $\Omega$-cm. On the outer surface of substrate 10, an epitaxial layer 12 is formed. Epitaxial layer 12 may comprise for example a layer of epitaxially created single-crystalline silicon which is on the order of 9.3 microns in thickness and which is doped with P type impurities to a resistivity on the order of 7 $\Omega$-cm. Together, layers 10 and 12 form a semiconductor substrate 14 on which active electronic devices and isolation structures may be formed. On the outer surface of substrate 14, a layer of silicon nitride 16 is deposited to a depth on the order of 1400 Angstroms.

Figure 1B:
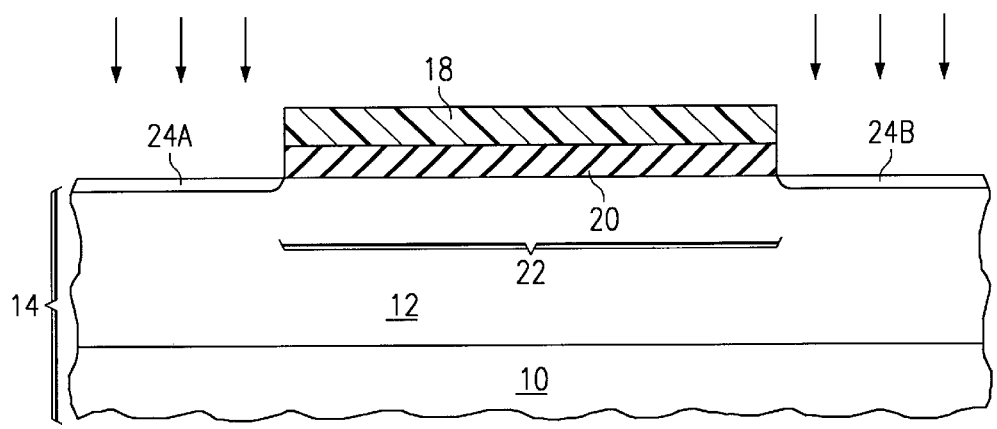

Referring to FIG. 1B, a first layer of photoresist 18 is deposited on the outer surface of silicon nitride layer 16. Layer 18 is then patterned using conventional photolithographic processes to define the boundaries of an inner mask layer 20 shown in FIG. 1B. Inner mask layer 20 comprises the remainder of silicon nitride layer 16 following conventional etch processes using photoresist layer 18. Inner mask layer 20 defines an active region 22 of substrate 14. As will be shown herein, a field effect device may be formed in active region 22. The outer boundaries of active region 22 may be used to form isolation structures comprising channel stop implant regions and field oxide formations.

Following the formation of inner mask layer 20, a first channel stop implant process may be performed to form shallow channel stop regions 24a and 24b shown in FIG. 1B. This step is optional for the formation of an N-channel transistor. The first channel stop implant process may comprise, for example, the implantation of phosphorous ions at a dose of 2E12 ions/cm$^{-2}$ and at an energy of 150 KeV. It should be understood that the teachings of the present invention are described herein with reference to a P-type semiconductor substrate. Similar processes could be used on an N-type substrate. For example, in this case, the first channel stop regions 24a and 24b would then comprise P type impurities.

Figure 1C:
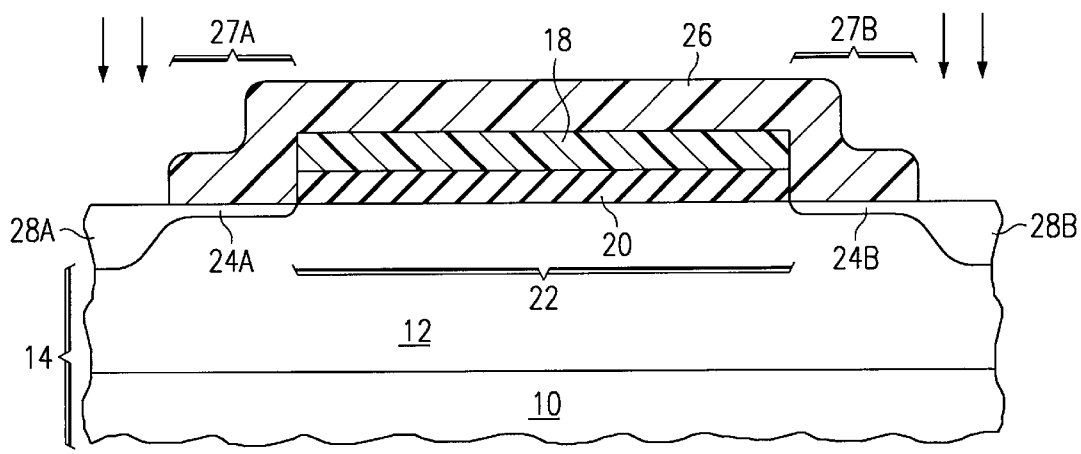

Referring to FIG. 1C, an outer mask layer 26 is. formed by depositing and patterning an additional layer of photoresist material using conventional photolithographic processes. As shown in FIG. 1C, outer mask layer 26 covers inner mask layer 20 and first photoresist layer 18 and further extends to cover portions of the outer surface of substrate 14 and regions 24a and 24b beyond the boundaries of inner mask layer 20. This sizing of outer mask layer 26 defines lateral extension zones 27a and 27b on either side of the periphery of inner mask layer 20. Extension zones 27a and 27b serve to separate additional channel stop implant regions to be formed from the active region 22 described previously.

Referring again to FIG. 1C, a second channel stop implant process is used to form a different channel stop regions 28a and 28b shown in FIG. 1C. For example, the second channel stop implant process may entail, for example, the implantation of boron ions at a dose of 2.25E13 ions/cm$^{-2}$ and at an energy of 100 KeV. As discussed previously, an opposite type of doping species would be used to form channel stop implant regions on an N-type substrate.

Figure 1D:
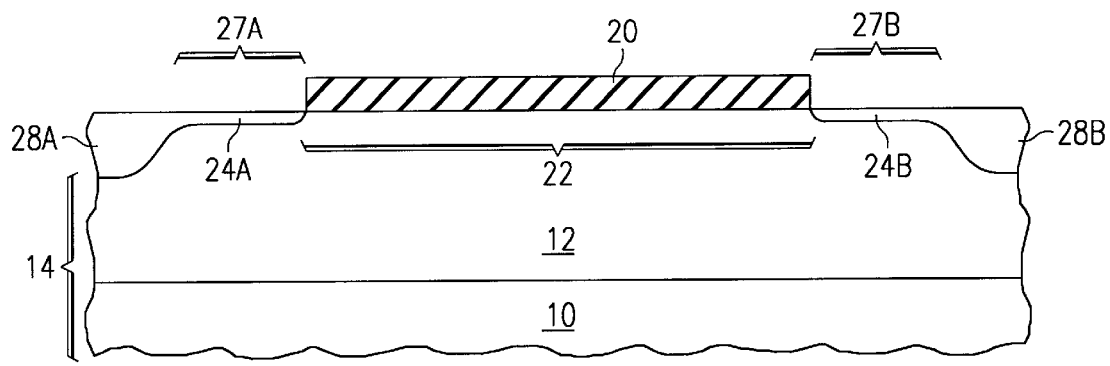

Following the formation of second channel stop regions 28a and 28b, the outer mask layer 26 and first photoresist layer 18 are stripped using conventional processes to reveal the structure as shown in FIG. 1D.

Figure 1E:
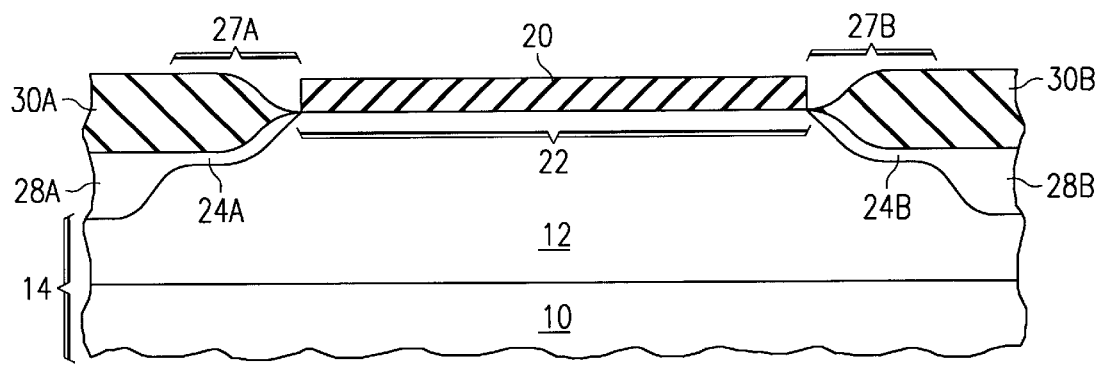

Referring to FIG. 1E, the resulting structure is subjected to a heating process in an oxygen environment to form field oxide structures 30a and 30b. The formation of structures 30a and 30b may be accomplished by heating the structure to approximately 900 degrees centigrade for on the order of 8 hours. This process will result in the formation of silicon dioxide layer on the order of 6000 angstroms in thickness. This process serves to drive the first channel stop regions 24a and 24b and the second channel stop regions 28a and 28b further into the substrate 14. The inner mask layer 20 prevents the formation of field oxide within the active region 22. As can be seen in FIG. 1E, the active region 22 is separated from the second channel stop implant regions 28a and 28b by the lateral extension zones 27a and 27b, respectively.

Figure 1F:
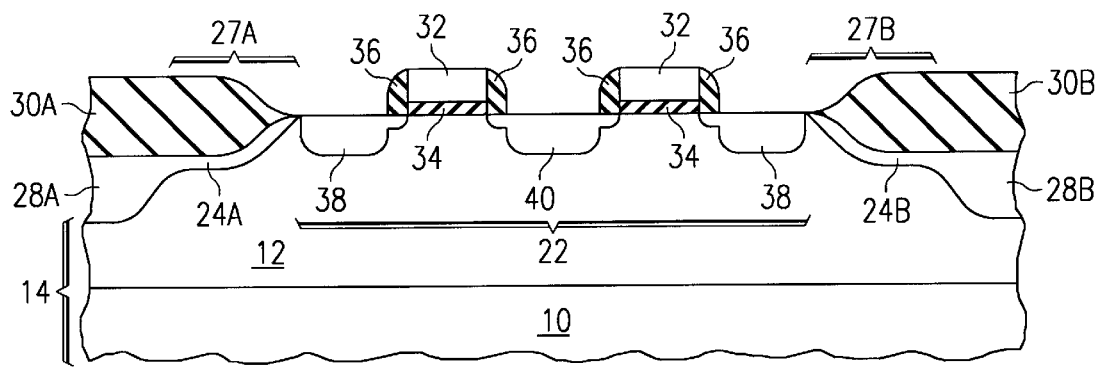

FIG. 1F illustrates the placement of a field effect device within active region 22 following the removal of inner mask layer 20 using conventional processes. The field effect device shown comprises a gate conductor 32 which is formed in a square or ring structure resulting in the appearance of two separate portions of gate conductor 32 in FIG. 1F. Gate conductor 32 is separated from the outer surface of active region 22 by a gate oxide layer 34. Gate oxide layer 34 comprises a layer of silicon dioxide on the order of 425 Angstroms in thickness. Gate conductor 32 is formed from a layer of polycrystalline silicon deposited to a depth on the order of 5000 Angstroms in thickness. To aid in the formation of source and drain regions, sidewall insulator bodies 36 are formed on the periphery of gate conductor 32. Sidewall insulator bodies 36 are formed from a layer of silicon dioxide or silicon nitride on the order of 3000 Angstroms in thickness. A peripheral drain region 38 and a central source region 40 are formed through the use of a LDD implant process followed by a deep source drain implant process. The LDD implant may comprise for the example, the implantation of phosphorous ions at a dosage of 2.25E13 ions/cm$^{-2}$ and an energy of 80 KeV. The LDD implant process occurs prior to the formation of sidewall insulator bodies 36. The following source drain implant may comprise, for example, the implantation of arsenic ions at a dose of 3E15 ions/cm$^{-2}$ at an energy of 150 KeV as well as phosphorous ions at a dose of 4.7E14 at an energy of 100 KeV.

As shown in FIG. 1F, the active region 22 and especially the peripheral source regions 38 are separated from the second channel stop implant regions 28a and 28b by the lateral extension zones 27a and 27b. Using the techniques described herein, the second channel stop implant regions 28a and 28b can be separated from the active region by on the order of 2 to 3 microns without substantially changing the isolation characteristics of the combination of the channel stop implants and the field oxide structures. By spacing the second channel stop implant regions 28a and 28b from the active region 22 by 2 to 3 microns, the operational breakdown voltage the device can be changed from on the order of 14 volts to on the order of 28 volts. This doubling in breakdown voltage allows a much more flexible operational region for the field effect device as shown. It should be understood that although the teachings of the present invention have been described with reference to the construction of a field effect transistor, the teachings of the present invention as to the formation of isolation structures which are spaced apart from the active region are equally applicable to the creation of other active devices within the active region which would have similar breakdown characteristics between implanted regions on the periphery of the active device and the second channel stop implanted regions of the isolation structures.

Figure 1G:
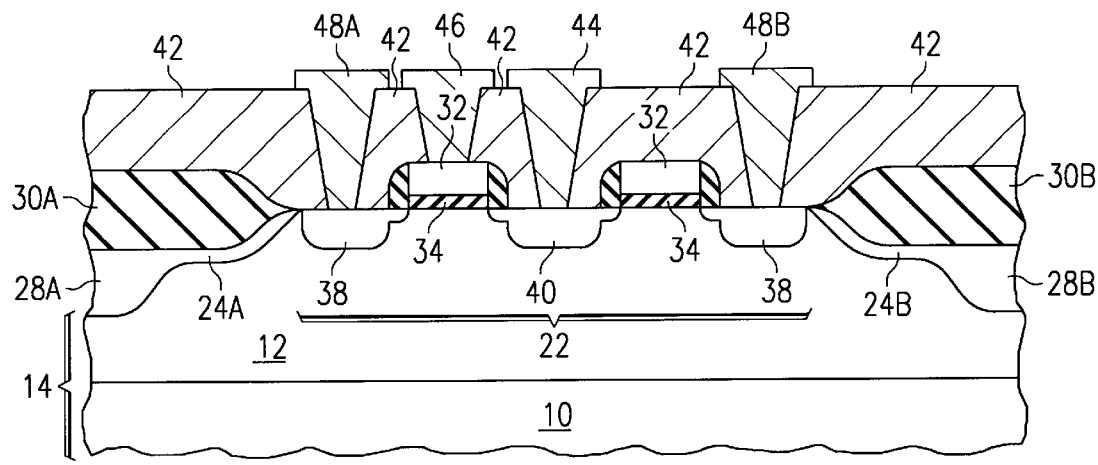

Finally referring to FIG. 1G, the completed device is formed through the deposition of an isolation insulator layer 42 which may comprise several thousand Angstroms of silicon dioxide. Contact openings are made within layer 42 using conventional photolithographic processes. Following the formation of these openings, a source contact 44, a gate contact 46 and drain contacts 48a and 48b may be formed by depositing a layer of conductive material such as aluminum or copper and patterning the layer using conventional photolithographic and etching processes.

Accordingly, an architecture and a method of construction are provided that allow for the formation of active devices which are isolated from other structures in a substrate by isolation structures. The isolation structures and the active devices are formed in a way that the periphery of the active devices are separated from the second channel stop regions of the isolation structures to prevent the formation of parasitic devices and to increase the breakdown voltage of the overall architecture.

Although the present invention has been described in detail, it should be understood that various substitutions, modifications and alterations may be made to the teachings contained herein without departing from the spirit and scope of the present invention which is solely defined by the appended claims.

What is claimed is:

1. A method of forming an electronic device in a semiconductor layer, comprising:

forming an inner mask layer defining an active region on the outer surface of the semiconductor layer;

implanting a first n-type channel stop region into the semiconductor layer on the periphery of the inner mask layer;

forming an outer mask layer covering the inner mask layer and portions of the outer surface of the semiconductor layer around the periphery of the inner mask layer, the portions of the semiconductor layer covered by the outer mask layer and not by the inner mask layer defining an extension zone;

implanting a second p-type channel stop region in the semiconductor layer around the periphery of the outer mask layer; removing the inner and outer mask layers; and forming an electronic device in the active region, the electronic device comprising implanted regions at the periphery of the active region, the implanted regions of the electronic device separated from the second channel stop region by at least the extension zone.

2. The method of claim 1 wherein the electronic device comprises a field effect transistor and wherein the implanted region of the device at the periphery of the active region comprise a source or drain of the field effect transistor.

3. The method of claim 1 wherein the inner mask layer comprises silicon nitride.

4. The method of claim 1 wherein the outer mask layer comprises photoresist.

5. A method of forming an electronic device in a semiconductor layer, comprising:

forming an inner mask layer defining an active region on the outer surface of the semiconductor layer;

implanting a first n-type channel stop region into the semiconductor layer on the periphery of the inner mask layer;

forming an outer mask layer covering the inner mask layer and portions of the outer surface of the semiconductor layer around the periphery of the inner mask layer, the portions of the semiconductor layer covered by the outer mask layer and not by the inner mask layer defining an extension zone;

implanting a second p-type channel stop region in the semiconductor layer around the periphery of the outer mask layer;

removing the inner and outer mask layers;

forming an electronic device in the active region, the electronic device comprising implanted regions at the periphery of the active region, the implanted regions of the electronic device separated from the second channel stop region by at least the extension zone; and forming a field oxide layer proximate the first n-type and the second p-type channel stop regions prior to removing the inner mask layer but after removing the outer mask layer.

6. The method of claim 5 wherein the electronic device comprises a field effect transistor and wherein the implanted region of the device at the periphery of the active region comprise a source or drain of the field effect transistor.

7. The method of claim 5 wherein the inner mask layer comprises silicon nitride and the outer mask layer comprises photoresist.

8. A method of forming an electronic device in a semiconductor layer, comprising:

forming an inner mask layer defining an active region on the outer surface of the semiconductor layer;

implanting a first p-type channel stop region into the semiconductor layer on the periphery of the inner mask layer;

forming an outer mask layer covering the inner mask layer and portions of the outer surface of the semiconductor layer around the periphery of the inner mask layer, the portions of the semiconductor layer covered by the outer mask layer and not by the inner mask layer defining an extension zone;

implanting a second n-type channel stop region in the semiconductor layer around the periphery of the outer mask layer;

removing the inner and outer mask layers; and forming an electronic device in the active region, the electronic device comprising implanted regions at the periphery of the active region, the implanted regions of the electronic device separated from the second channel stop region by at least the extension zone.

9. The method of claim 8 wherein the electronic device comprises a field effect transistor and wherein the implanted region of the device at the periphery of the active region comprise a source or drain of the field effect transistor.

10. The method of claim 8 wherein the inner mask layer comprises silicon nitride.

11. The method of claim 8 wherein the outer mask layer comprises photoresist.

12. A method of forming an electronic device in a semiconductor layer, comprising:

forming an inner mask layer defining an active region on the outer surface of the semiconductor layer;

implanting a first p-type channel stop region into the semiconductor layer on the periphery of the inner mask layer;

forming an outer mask layer covering the inner mask layer and portions of the outer surface of the semiconductor layer around the periphery of the inner mask layer, the portions of the semiconductor layer covered by the outer mask layer and not by the inner mask layer defining an extension zone;

implanting a second n-type channel stop region in the semiconductor layer around the periphery of the outer mask layer;

removing the inner and outer mask layers;

forming an electronic device in the active region, the electronic device comprising implanted regions at the periphery of the active region, the implanted regions of the electronic device separated from the second channel stop region by at least the extension zone; and forming a field oxide layer proximate the first p-type and the second n-type channel stop regions prior to removing the inner mask layer but after removing the outer mask layer.

13. The method of claim 12 wherein the electronic device comprises a field effect transistor and wherein the implanted region of the device at the periphery of the active region comprise a source or drain of the field effect transistor.

14. The method of claim 12 wherein the inner mask layer comprises silicon nitride and the outer mask layer comprises photoresist.

* * * * *